United States Patent [19]

Balch et al.

[11] Patent Number: 4,491,791
[45] Date of Patent: Jan. 1, 1985

[54] SENSING SWITCH FOR A DETACHABLE COMMUNICATIONS PROBE

[75] Inventors: Richard A. Balch, Somersworth; Ansell W. Palmer, Hampton, both of N.H.

[73] Assignee: General Electric Company, Somersworth, N.H.

[21] Appl. No.: 449,257

[22] Filed: Dec. 13, 1982

[51] Int. Cl.³ ............... G01R 11/04; G02B 27/00; H04B 9/00; G08C 19/00
[52] U.S. Cl. ............... 324/157; 340/870.02; 340/870.03; 455/602; 455/607; 250/551
[58] Field of Search ............. 324/113, 116, 157; 346/14 MR; 335/2, 205; 340/870.02, 870.03; 361/158; 200/51 R, 51.09; 73/861, 272; 455/602, 607; 250/551

[56] References Cited

U.S. PATENT DOCUMENTS

| 2,076,136 | 4/1937 | Weed | 200/51.09 |
| 4,050,020 | 9/1977 | Germer et al. | 324/116 |
| 4,081,746 | 3/1978 | Snyder et al. | 324/116 |
| 4,082,999 | 4/1978 | Staker | 324/116 |
| 4,275,947 | 6/1981 | Takagi | 200/51.09 X |
| 4,298,839 | 11/1981 | Johnston | 324/157 |

FOREIGN PATENT DOCUMENTS

| 1217593 | 12/1970 | United Kingdom | 324/157 |
| 1330076 | 9/1973 | United Kingdom | 324/157 |

*Primary Examiner*—Gerard R. Strecker
*Assistant Examiner*—Warren S. Edmonds
*Attorney, Agent, or Firm*—Robert E. Brunson

[57] ABSTRACT

A magnetically coupled communication port includes a push-button switch operable by depressing a plunger slidably mounted in a detachable coupler assembly for providing an enable signal upon coupling of the detachable coupler assembly to a fixed coupler assembly. The plunger is depressed by engagement therewith of a face portion of the fixed coupler assembly upon the magnetic attachment of the detachable coupler assembly with the fixed coupler assembly.

21 Claims, 9 Drawing Figures

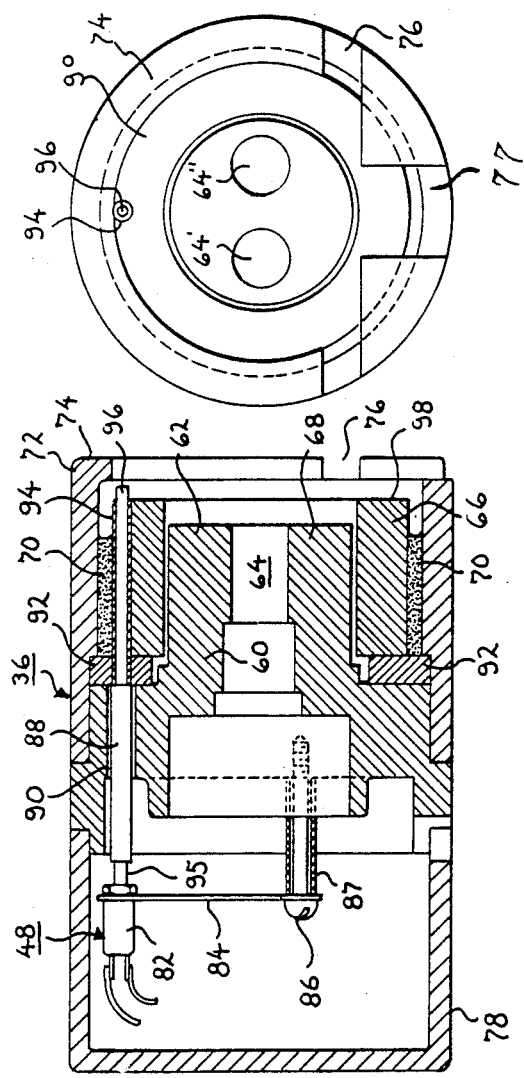
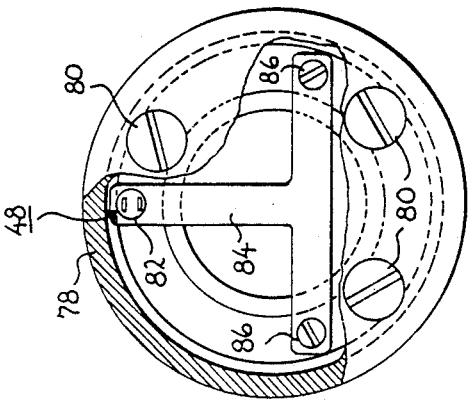
FIG. 4
FIG. 2
FIG. 3

SENSING SWITCH FOR A DETACHABLE COMMUNICATIONS PROBE

BACKGROUND OF THE INVENTION

The present invention relates generally to communication coupler devices and more particularly to such devices having magnetic and optical characteristics which allow mating magnetic couplers to be joined for the transfer of information between electronic devices.

The present invention is useful in those types of applications where it is desirable or necessary to electronically communicate with electronic circuitry which is inaccessably housed, such as within a sealed enclosure. To this end, and as a preferred embodiment, the invention finds particular application in utility meters of the computerized electronically programmable type. These types of meters are most frequently designed to be programmed or re-programmed at the place of installation, such as at the customer residence or a commercial business site. Ideally, these types of meters are designed for electronic readout of meter data, for example total kilowatt hour consumption, demand kilowatt consumption and the like.

Programming and reading of the above types of meters is normally done by a utility company meter reader or service person utilizing a portable reader/programmer device. This device is usually provided with some type of plug device for attachment to the meter to enable the reader/programmer to communicate with the electronics inside the meter cover.

The use of an optical coupler for programming meters of the above type is made attractive because of the economic design and manufacturing cost incentives such a coupler affords. A further attractive feature is the high reliability of optical emitter and detector devices employed in such couplers.

One type of optical coupler is shown and described in co-pending U.S. patent application Ser. No. 533,895, which is a continuation of Ser. No. 190,217, filed Sept. 24, 1980 now abandoned and which is assigned to the assignee of the present invention and which is incorporated by reference in the present application as if fully set forth herein. That coupler comprises a first coupler assembly which is rigidly mounted through the meter cover and a second detachable coupler assembly which can be magnetically attached to the first coupler assembly. The coupler is constructed such that precise alignment is maintained between the first and second coupler assemblies when they are magnetically attached to each other while inhibiting the entry of ambient light from entering between the coupled portions.

Although the aforementioned magnetic optical coupler provides an economical and reliable means for communicating with electronic devices which are sealed within a housing or cover, a need exists for a means of signaling the reader/programmer device that the magnetic coupler has been mated. Such a signal can be used by the reader/programmer device to enable the optical emitter and detector devices located within the detachable coupler assembly as well as to provide an indication that communication with the enclosed electronic meter circuitry through the mated coupler is ready to take place thereby enabling the reader/programmer device to perform such communication. The signaling means should be reliable and be able to signal automatically upon mating and upon disengagement of the coupler.

SUMMARY OF THE INVENTION

The aforementioned needs are satisfied by the present invention by the provision of a switch assembly which is automatically activated upon engagement of two mating segments of a communications coupler. The invention, in a preferred embodiment, is advantageously applied in utility meters of the electronically programmable type, which can be externally programmed by a portable reader/programmer device having a communications coupler which is detachably coupled to the utility meter.

In applying the apparatus of the invention, a first coupler assembly is mounted through a meter cover. This first coupler assembly is preferably fabricated from a magnetically conductive material. The coupler assembly contains a face portion which is mounted external of the meter cover. An aperture extends from this face portion into the coupler assembly. At least one optical communication means is disposed in the aperture, and is oriented therein to provide a communication path for the optical communication means through the aperture in the face portion of the coupler assembly. This optical communication means is connected to electronic circuitry inside the meter cover.

A second coupler assembly is provided for magnetic attachment to the first coupler assembly. The second coupler assembly is preferably constructed as a magnet having a magnetized surface for mating magnetic attachment to the face portion of the first coupler assembly. A spring loaded switch, having a plunger extending therefrom, is positioned within the second coupler assembly such that the end of the plunger extends beyond the magnetized surface prior to attachment to the first coupler assembly. In this position, the switch is in a first or unactivated position.

In a manner similar to the first coupler assembly, the second coupler assembly also contains an aperture extending from its magnetized surface into the body of the second coupler for the containment of a second optical communication means. The orientation of the second optical communication means in the aperture of the second coupler assembly provides an optical communication path through the aperture for the establishment of a communication link between the first and second optical communication means when the two coupler assemblies are magnetically coupled. A portable reader/programmer device is connected to the second optical communication means to complete communication with the meter electronic circuitry via the mated optical coupler.

When the first and second coupler assemblies are magnetically coupled, the face portion of the mated first coupler assembly has engaged and depressed the switch plunger until the plunger end is substantially flush with the magnetized surface of the second coupler assembly thereby causing the switch to switch from its unactivated to its activated position. In the preferred embodiment, the activation of this switch enables the portable reader/programmer to communicate with the meter electronic circuitry via the mated optical coupler.

It is therefore an object of the present invention to provide an optical coupling apparatus for the transfer of electronic information which includes a device for enabling and inhibiting the transfer of information over the optical link.

It is another object of the present invention to provide a magnetically detachable optical coupling apparatus characterized by incorporating a switch which is automatically activated upon coupling to enable transfer of information through a communication link established by the coupled apparatus.

Still another object of the invention is to provide a combination magnetic and optical coupler apparatus which enables the electronic communication between electronic circuitry housed within a sealed cover of a meter and a portable electronic communication device connected external of the meter housing.

It is yet another object of the present invention to provide a combination optical magnetic coupler apparatus including means for enabling optical detector and/or emitter devices to effect upon coupling, unidirectional or bidirectional communication with an electronically programmable meter from a portable reader/programmer device connected external of the meter cover having electronics inaccessably housed therein.

These and other objects, features and advantages of the present invention will become more fully apparent from the following detailed description of the preferred embodiment, the appended claims and the accompanying drawing.

BRIEF DESCRIPTION OF THE DRAWINGS

FIG. 2 is a side view, partly in cross-section, of a second coupler assembly of the present invention.

FIG. 3 is an end view, partly in cross-section, showing a portion of the second coupler assembly of FIG. 2 looking into the left side thereof.

FIG. 4 is an end view showing a portion of the second coupler assembly of FIG. 2 looking into the right side thereof.

DESCRIPTION OF THE PREFERRED EMBODIMENT

Figure 1:
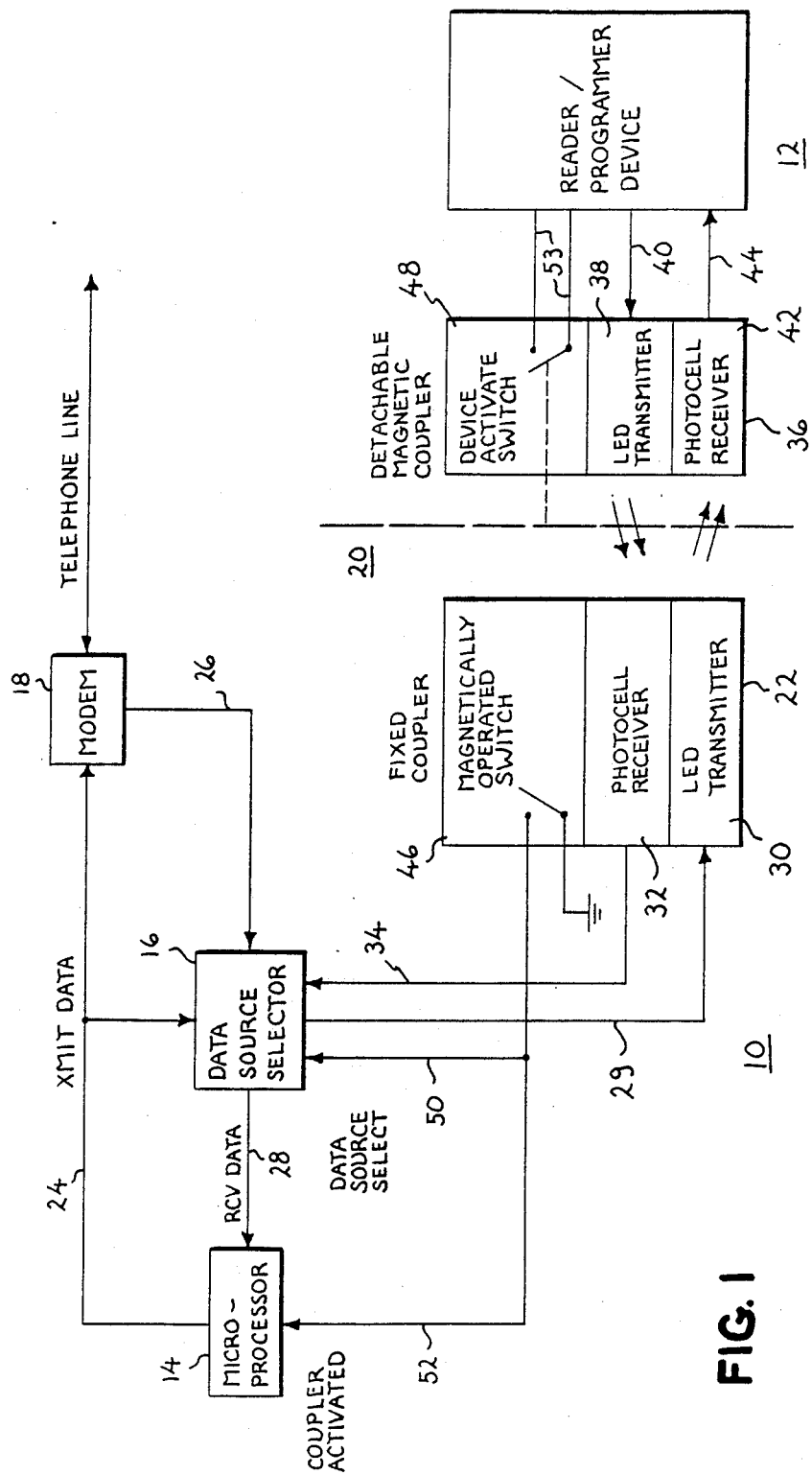
FIG. 1 is a functional block diagram depicting the flow of information between a reader/programmer device and an electronically programmable meter through a magnetic optical coupler incorporating a coupler sensing switch of the present invention.

Referring now to FIG. 1, there is shown a functional block diagram illustrating the flow of information between an electronically programmable meter, generally designated 10 and a portable reader/programmer device, generally designated 12. The electronically programmable meter includes a microprocessor 14 for receiving, processing and outputting data. The meter also includes a data source selector 16 for selecting one of at least two meter communication paths. As shown in FIG. 1, these communication paths are between either a central data acquisition and transmission system (not shown), via a telephone line modem 18, or the portable reader/programmer device 12 via an optical coupler generally designated 20, having a fixed coupler segment 22 sealably mounted through a meter cover or housing (not shown) preferably in accordance with the teachings of the aforementioned U.S. patent application Ser. No. 533,895.

When the data source selector 16 selects the telephone modem 18, outbound data from the meter 10 flows to the modem 18 by way of a transmit data (XMIT DATA) path 24. Inbound data flows from the telephone modem 18 to the data source selector 16 by way of a first inbound data path 26. In this mode of communication, the data source selector 16 transmits the inbound data from the first inbound data path 26 to the microprocessor 14 over a receive data (RCV DATA) path 28.

When communicating with the programmer/reader device 12, outbound data flows from the microprocessor 14 over the XMIT DATA path 24, through the data source selector 16, over an outbound data path 29 to a light emitting diode (LED) transmitter 30 which is mounted within the fixed coupler segment 22 of the magnetic optical coupler 20, as shown and described in the aforementioned U.S. patent application Ser. No. 533,895. In this mode of communication, inbound data flows from a photocell receiver 32, which is housed within the fixed coupler segment 22 of the optical coupler 20, as shown and described in the aforementioned U.S. patent application, to the data source selector 16 by way of a second inbound data path 34. The data source selector 16 transmits the data from the second inbound data path 34 to the microprocessor 14 over the RCV DATA path 28.

The reader/programmer device 12, is electrically connected to a detachable magnetic coupler segment 36 of the optical coupler 20. The detachable magnetic coupler segment 36 is adapted to mate with and magnetically couple to the fixed coupler segment 22 of the optical coupler 20. The detachable magnetic coupler segment 36 includes a light emitting diode (LED) transmitter 38 which receives a data signal from the reader/programmer device 12 over an outbound data path 40. The detachable magnetic coupler segment 36 also includes a photocell receiver 42 which emits data signals to the reader/programmer device 12 over the inbound data path 44. The LED transmitter 38 and the photocell receiver 42 are mounted in the detachable magnetic coupler segment 36 preferably in the manner shown and described in the aforementioned U.S. patent application Ser. No. 533,895.

The fixed coupler segment 22 of the optical coupler 20 also includes a magnetically operated switching means 46 which is activated upon magnetically coupling the detachable magnetic coupler segment 36 to the fixed coupler segment 22 as will be hereinafter described. The detachable magnetic coupler segment 36 also includes a device activate switch means 48 which is operated upon mating the detachable magnetic coupler segment 36 to the fixed coupler segment 22 as will be hereinafter described.

Upon activation, the magnetically operated switching means 46 closes and applies ground to a terminal of the data source selector 16, by way of input line 50, causing the selector 16 to switch from the telephone modem communication paths to the portable reader/programmer device communication paths. The magnetically operated switching means 46 also applies ground to an input of the microprocessor 14, over the input path 52, thereby alerting the microprocessor 14 that communication is to occur between the meter 10 and the portable reader/programmer device 12. Upon operation, the device activate switch means 48 closes thereby signalling the reader/programmer device 12, by way of lines 53, that the optical link 20 is coupled and communication with the meter 10 can begin. Such signalling would result in the application of battery power to the reader/programmer device 12 upon closure of switch 48.

Referring now to FIG. 2, there is shown a cross-sectional side view of a preferred embodiment of the detachable magnetic coupler segment 36 of the optical coupler 20. As previously described in connection with FIG. 1, the detachable coupler segment 36 is magnetically attachable to the mating fixed coupler segment 22. In its broadest context, the detachable coupler segment 36 may be comprised of a unitary magnet structure. As shown in FIG. 2, the structure of the coupler segment 36 comprises a non-magnetic body 60, having a face portion 62 preferably symmetrically designed to mate with a face portion on the fixed coupler segment 22 as will be subsequently described. The detachable magnetic coupler segment 36 has an aperture 64 extending into a cavity from the face portion of the body 60 for the retention of at least one optical communication device 65 (see FIG. 6). If only unidirectional communication is desired, there would be only one optical communication device 65 located within the aperture 64 and that device would communicate with a communication device of opposite type in an aperture of the fixed coupler segment 22, which will be subsequently described.

If bidirectional communication is desired, two apertures such as 64' and 64", as shown in FIG. 4, are formed in the body 60 to hold optical communication devices of opposite types, such as a light emitting diode (LED) and a phototransistor (not shown). These devices are mounted within the body 60 as shown and described in the aforementioned co-pending U.S. patent application Ser. No. 533,895, which application has been incorporated by reference in this application.

Again referring to FIG. 2, a magnet 66 is disposed around a front annular shoulder portion 68 of the body 60. As shown at 70 in FIG. 2, the magnet 66 is preferably held in place by a suitable cement, such as epoxy to rigidly attach the magnet 66 to the entire structure or body 60.

A cover 72, forming a part of the body 60 and magnet assembly 66, is attached to the body 60 by any suitable means such as counter sunk screws (not shown). The cover 72 is preferably of conductively magnetic material and serves essentially four purposes. The first of these purposes is to provide a partial protective cover for the coupler assembly 36. The second purpose is to provide a light shield, as shown at 74, in the form of a lip extending out over the face portion end of the magnet and the body assembly 66 and 60 respectively. Thirdly, the cover 72 provides a second alignment means 76 formed as a flat in the face portion end of the lip of the light shield 74. The alignment means 76 is symmetrically formed to co-act with a flat of alignment means positioned on a face portion of the fixed coupler segment 22 as will be subsequently described. And fourthly, the cover 72 serves as a return path of the magnetic flux, to thus improve the magnet holding force and increase the magnet retentivity.

The magnetic holding force is further enhanced by a conductively magnetic washer as spacer 92 disposed between the near face of magnet 66 and cover 72. The washer 92 provides a path for magnetic flux between cover 72 and the magnet 66.

To complete the detachable coupler segment 36 of FIG. 2, a second or rear cylindrical cover 78 is attached to body 60 by three screws 80 (see FIG. 3) threaded into the body 60. As can be seen in FIG. 2, the purpose of the cover 78 is to protect the wiring extending from components mounted inside the coupler 36. One of these components is the device activate switch means 48 comprising a switch 82 which is mounted on a mounting plate 84 which in turn is attached to and spaced from body 60 using attachment screws 86 and spacers 87. As shown more clearly in FIG. 3, the mounting plate 84 is preferably T-shaped with the switch 82 mounted near the end of the leg member of the T and the mounting screws 86 being inserted through the mounting plate 84 near the ends of the cross member. The switch 82 is preferably a momentary contact form A type, and is internally spring loaded in the out direction which is off.

Figure 5:
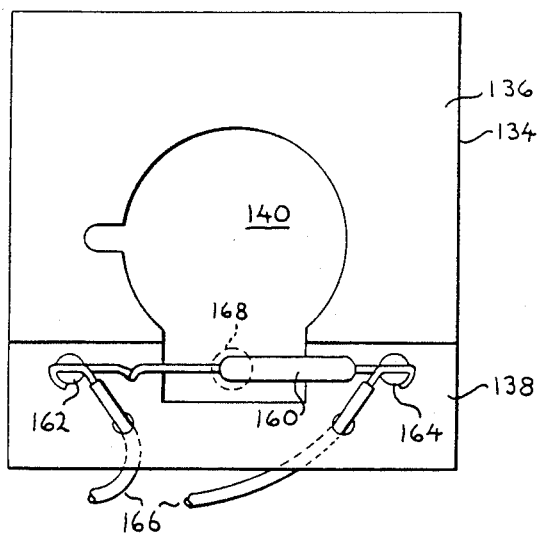
FIG. 5 depicts a terminal block having a magnetically activated switch mounted thereon.

A plunger 88 extends through an aperture 90 in the body 60. The plunger 88 also extends through an aperture in a washer 92 which is disposed between the magnet 66 and a shoulder on the body 60. Also extending through the aperture in the washer 92 and surrounding a portion of the plunger 88 is a bearing tube 94. The portion of the plunger 88 which is surrounded by the bearing tube 94 has a smaller diameter than the portion of the plunger 88 which is disposed through the aperture 90 in the body 60. These differences in diameters form a shoulder in the plunger which is urged against the washer 92 by the spring loaded switch pin 95. When the shoulder of the plunger 88 is urged against the washer 92, a portion 96 of the plunger 88 extends beyond a face portion 98 of the magnet 66. As will subsequently be described, when the face portion 98 of the magnet 66 engages a mating surface on the fixed coupler 20 (as shown in FIG. 5), the extending portion 96 of the plunger 90 will be depressed into the bearing tube 94, which in turn depresses the switch pin 95 causing the switch 82 to activate. As previously described the activation of the switch 82 signals the reader/programmer device 12 that the fixed coupler 22 and detachable magnetic coupler segments 36 of the optical coupler 20 have been mated and communication between the reader/programmer device 12 and the programmable meter 10 is enabled.

Figure 6:
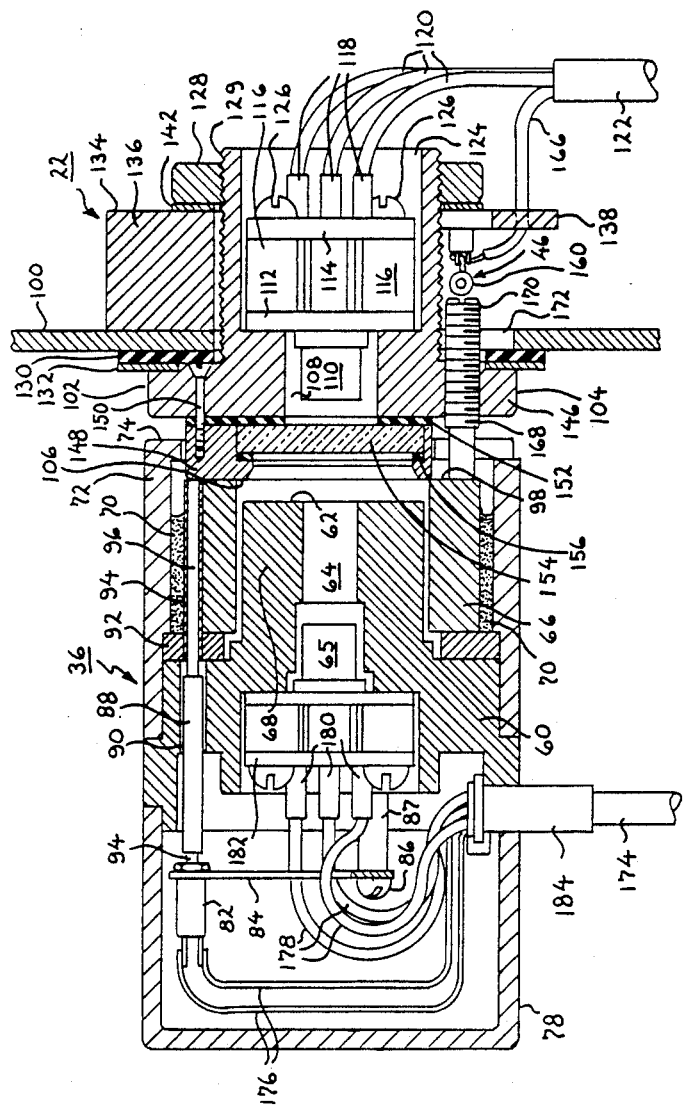
FIG. 6 is a side view, partly in cross-section, showing first and second coupler assemblies magnetically coupled for operation.

Referring now to FIG. 6, there is shown, in partial cross-section, a preferred embodiment of the optical link 20 of the present invention comprising the detachable magnetic coupler segment 36 in mating engagement with the fixed coupler segment 22. The fixed coupler segment 22 extends through and is attached to a cover 100 of the electronically programmable meter 10. In its broadest context, the fixed coupler segment 22 may be formed as an integral housing, or body generally shown as 102. The structure of the housing 102 is characterized by a body 104 having a face portion 106 and further having at least one aperture 108 extending from the face portion 106 into the body 104.

Figures 7, 8:
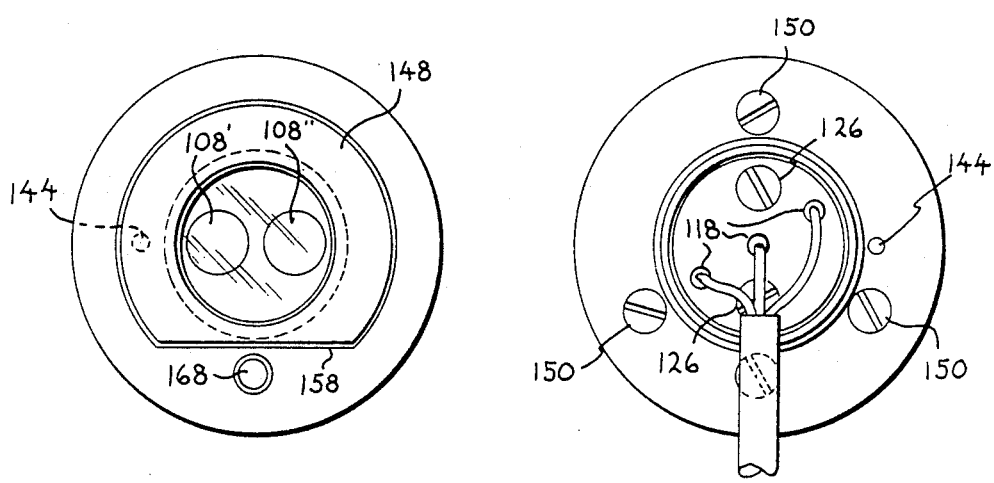
FIG. 7 is an end view showing a face portion of the first coupler assembly.
FIG. 8 is an end view showing a rear portion of the first coupler assembly.

As shown in FIG. 6, the aperture 108 contains at least one optical communication means or device 110 mounted within aperture 108 and held in place by circuit boards 112 and 114. The boards 112 and 114 are displaced by two spacers generally shown as 116. The leads of the optical device 110 are bought through suitable holes in the circuit board 114 and are soldered to connecting terminals 118. Three conductors 120 of a cable 122 are also soldered to the terminal connectors 118. The entire assembly, comprising the optical device 110 and the circuit boards 112 and 114, is secured in place within a cavity 124 of the body 104 by two retaining screws 126 as shown in FIGS. 6 and 8. These screws 126 are passed through the spacers 116 and screwed into the body 104 through threads (not shown) in the body 104.

Figure 9:
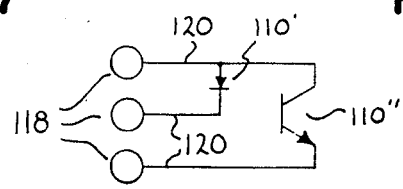
FIG. 9 is an electrical schematic showing the wiring of optical communication devices used in each of the first and second couplers of the present invention.

In the preferred embodiment where information is to be bidirectionally transferred, two apertures 108' and 108" are formed in the body 104 (see FIG. 7). Mounted within these two apertures are associated optical communication devices 110' and 110" shown in FIG. 9 as an emitter, such as a light emitting diode 110', and a collector, such as a photocell 110". FIG. 9 schematically shows the wiring of wires 120 of cable 122 for connecting these optical communication devices to the circuit board 114 at terminals 118.

The entire fixed coupler segment 22 is rigidly attached to the meter cover 100 by a nut 128 screwed onto the body 104 from the inside of the meter cover 100. To protect the inside of the meter from outside elements (such as moisture and dirt), a gasket 130 is placed on the outside of the meter cover 100 between the cover 100 and a flat washer 132. A component mounting block 134 having a thick portion 136, a thin portion 138 and an aperture 140 (see also FIG. 5) is disposed between the meter cover 100 and the nut 128 with the threaded portion 129 of the body 104 extending through the aperture 140. A flat washer 142 is placed between the nut 128 and the component mounting block 134 to prevent damage to the mounting block 134 as the nut 128 is tightened against it. In a preferred embodiment, the body 104 has an alignment pin 144 (see FIGS. 7 and 8) in the backside of an annular shoulder 146 which aligns with a mating hole in the meter cover 100 to prevent the fixed coupler segment 22 from turning and insure that the coupler 22 is properly oriented when installed.

Still referring to FIG. 6, a portion of the body 104 includes a face cover 148, fabricated from a soft iron, magnetically conductive material. As shown in FIGS. 6 and 8, this cover 148 is attached to the body 104 by three screws 150 threaded from the backside of the shoulder 146 into the backside of the cover 148. To complete the sealing arrangement of the fixed coupler segment 22, a gasket 152 is interposed between the shoulder 146 and the cover 148.

A light path is provided through the cover 148, which has an opening or aperture in the face portion to allow light communication through the front of the cover with the optical device 110. For protection of the optical device 110 a transparent cover 154 is disposed within the cover 148. The transparent cover 154 is preferably fabricated from a high impact plastic or glass substance impervious to breakage. The sealing arrangement of the fixed coupler segment 22 is further enhanced by means of another gasket 156 disposed between the transparent cover 154 and a shoulder on the inside of the cover 148.

As best seen in FIG. 7, the body 104, and the cover 148 forming a part thereof, also includes a first alignment means 158 shown as a flat on the bottom side of the cover 148. This alignment means 158 is configured to symmetrically align with the corresponding alignment means 76 on the cover 72 of the detachable magnetic coupler segment 36.

Referring to FIGS. 5 and 6, there is shown the magnetically operated switching means 46, which comprises a magnetically activated reed switch 160 electrically connected between a first 162 and second 164 terminal posts disposed on the thin portion 138 of the component mounting board 134. A pair of conductors 166 of the cable 122 are electrically connected to the terminals 162 and 164.

A cylindrically shaped soft iron slug 168 having a threaded end portion 170 extends through a threaded aperture in the body 104. The slug 168 is threaded through the body 104 to a position at which the end of the slug 168 extending from the body 104 just makes contact with the face portion 98 of the magnet 66 of the detachable magnetic coupler segment 36 when the detachable coupler segment 36 has been magnetically coupled to the fixed coupler segment 22 as shown in FIG. 6. The magnetic reed switch 160 is mounted on the thin portion 138 of the mounting block 134 in a position such that when the block 134 is assembled to the body 104, the magnetic reed switch 160 is positioned in close proximity to the other end of the iron slug 168 as shown in FIG. 6.

The purpose of the aforementioned adjustment of the iron slug 168 and the positioning of the magnetic reed switch 160 with respect to the iron slug 168 is as follows. When the detachable magnetic coupler segment 36 is magnetically coupled to the fixed coupler segment 22 as shown in FIG. 6, the soft iron slug 168 will conduct magnetic flux from the magnet 66 of coupler segment 36 to the reed switch 160, causing the reed switch to activate. The reed switch 160, which in the preferred embodiment is normally open, is therefore closed by this magnetic flux and held closed as long as the detachable coupler segment 36 is attached to the fixed coupler segment 22. When the detachable coupler segment 36 is detached from the fixed coupler segment 11, the reed switch 160 will open because of the absence of magnetic flux.

This magnetic switch will operate satisfactorily through a steel cover 100 as well as covers made of nonmetallic material. However, when used with a steel cover, a reasonable clearance aperture must be provided between the iron slug 168 and the cover 100. Such an aperture is shown in FIG. 6 and designated by the reference numeral 172.

The detachable magnetic coupler segment 36 is electrically connected to the reader/programmer device 12 by means of a cable 174 as shown in FIG. 6. The cable 174 contains the wires 176 which are electrically connected to the terminals of the switch 82 as well as the wires 178 which are electrically connected to the optical communication devices 65 by way of the terminals 180 mounted on printed circuit board 182. To prevent fraying of the wiring on cable 74, a rubber protective grommet 184 is preferably installed between the body 60 and the cover 78.

The advantages of the present invention are believed to best be realized by the utilization of a pulse code or binary communication protocol between the portable reader/programmer device 12 and the electronically programmable meter 10. When using such a protocol, the emitter devices (such as diodes 65' and 110') are pulsed by electronic signals from their respective connected electronics to transmit light pulses across the communication link to their corresponding collector devices (such as phototransistors 65" and 110") which in turn convert those light pulses to electronic pulses for reception by the electronic circuitry to which the collector devices are connected.

This type of communication protocol is particularly advantageous when used with a meter, which is shown in block diagram form as 10 in FIG. 1, which implements a programmable microprocessor 14 which must be interrogated and programmed by an external device such as the portable reader/programmer device 12. In such a meter, it is important that the microprocessor 14 know whether it is communicating with the modem 18 or the reader/programmer device 12. In addition, in order to prevent spurious light from being interpreted as programming information prior to mating of the coupler segments 22 and 36 as well as to protect and extend the life of the operational communication devices 110 contained within the fixed coupler segment 36, it is necessary that the optical communication devices remain unenergized until mating of the segments has occurred. These functions are provided by the magnetically operated switch segment 46 which is activated by the magnet 66 of the detachable coupler segment 36 through the soft iron slug 168 of the fixed coupler segment 22 upon mating of the detachable coupler segment 36 to the fixed coupler segment 22 as previously described.

In addition, it is important that the reader/programmer device 12 knows that the communication link required for communication with the electronically programmable meter 10 has been properly implemented. This 'knowledge" is imparted to the reader/programmer device 12 by means of the device activate switch means 48 which closes upon mating of the detachable coupler segment 36 to the fixed coupler segment 22 as previously described.

From the foregoing description of the invention, it will be apparent that further modifications and alternative embodiments of it may be made without departing from its teachings; accordingly, it is our intention to encompass within the following claims the true spirit and scope of the invention.

What we claim is:

1. In a system of the type including a meter having electronic circuitry housed within a cover of the meter and external communication apparatus adapted for communication with said electronic circuitry, means for providing a detachable communications link between said external communication apparatus and said electronic circuitry through said meter cover, said means comprising:
   (a) a fixed coupler assembly of magnetically conductive material rigidly mounted through a portion of said meter cover, said fixed coupler assembly having a face portion external of the meter cover and including an aperture extending into said fixed coupler assembly from the face portion, said fixed coupler assembly further including,
      (1) a communication means of a first type disposed in the aperture of said fixed coupler assembly for communication external to the meter cover at the face portion of said fixed coupler assembly, and
      (2) means connecting said communication means to the electronic circuitry for electronically communicating therewith; and
   (b) a detachable coupler assembly having a magnetized surface on one end thereof adapted for magnetically engaging said face portion of said fixed coupler assembly and including an aperture extending into said detachable coupler assembly from the magnetized surface, the detachable coupler assembly further including
      (1) a communication means of a second type disposed in the aperture of said detachable coupler assembly for communication out the magnetized surface end thereof,
      (2) means for providing an enable signal for activating said communication means of a second type to permit communication of information upon coupling of said detachable and fixed coupler assemblies, and
      (3) means connecting the enable signal providing means and the communication means of said second type to the external communication apparatus for electroncially communicating information between said external communication apparatus and said electronic circuitry in the meter cover, via the communication means of said first and second types, following receipt by said external communication apparatus of said enable signal.

2. The system in accordance with claim 1 wherein said enable signal providing means of said detachable coupler assembly comprises:
   (a) a plunger slidably disposed in said detachable coupler assembly, said plunger being movable between at least a first position wherein a first end of said plunger extends beyond said magnetized surface and a second position wherein said first end is substantially co-planar with said magnetized surface; and
   (b) switching means mounted on said detachable coupler assembly in cooperating relationship with said plunger whereby movement of said plunger from said first to said second positions causes said switching means to switch from an unactivated to an activated state.

3. The system in accordance with claim 2 wherein said switching means comprises a switch switchable from said unactivated to said activated state by depression of a push-button which is spring loaded in an outward direction, said switch being mounted on said detachable coupler assembly with an outward end of said push-button engaging a second end of said plunger whereby said plunger is biased by said spring loaded push-button in said first position and movement of said plunger from said first to said second position causes the depression of said push-button.

4. The system in accordance with claim 3 wherein the communication means of said first type comprises an optical communication means of a first type and the communication means of said second type comprises an optical communication means of a second type.

5. The system in accordance with claim 4 wherein one of the optical communication means of said first and second types is a light emitting diode and the other of said first and second types is a photocell.

6. The system in accordance with claim 5 wherein said fixed coupler assembly further includes a transparent shield on the face portion thereof for protecting the optical communication means disposed in the aperture of said fixed coupler assembly.

7. Apparatus for establishing a communication link for the transfer of information comprising:
   (a) a first coupler assembly including,
      (1) a housing of magnetically conductive material, the structure of said housing being characterized by a cylindrical body having a face portion and being further characterized by an aperture extending from the face portion into said body,
 (2) a communication means of a first type disposed within the aperture of said housing for communication out of said face portion; and
(b) a second coupler assembly including,
 (1) a magnet for magnetic attachment to said first coupler assembly, the structure of said magnet being characterized by a cylindrical body having a face portion substantially symmetrical with the face portion of said first coupler assembly and being further characterized by an aperture extending from the face portion into said magnet, and positioned therein to align with the aperture in the face portion of said first coupler assembly,
 (2) a communication means of a second type disposed in the aperture of said magnet for communicating with the communication means of said first type in said coupler assembly, and
 (3) means for providing an enable signal for activating said communication means of a second type to permit communication of information upon coupling of said first and second coupler assemblies.

8. The apparatus in accordance with claim 7 wherein said enable signal providing means of said second coupler assembly comprises:
(a) a plunger slidably disposed in said magnet, said plunger being movable between at least a first position wherein a first end of said plugner extends beyond said face portion of said magnet and a second position wherein said first end is substantially co-planar with said face portion; and
(b) switching means, mounted on said second coupler assembly in cooperating relationship with said plunger whereby movement of said plunger from said first to said second positions causes said switching means to switch from an unactivated to an activated state.

9. The apparatus in accordance with claim 8 wherein said switching means comprises a switch switchable from said unactivated to said activated state by depression of a push-button which is spring loaded in an outward direction, said switch being mounted on said second coupler assembly with an outward end of said push-button engaging a second end of said plunger whereby said plunger is biased by said spring loaded push-button in said first position and movement of said plunger from said first to said second position causes the depression of said push-button.

10. The apparatus in accordance with claim 9 wherein the communication means of said first type comprises an optical communication means of a first type and the communication means of said second type comprises an optical communication means of a second type.

11. The apparatus in accordance with claim 10 wherein one of the optical communication means of said first and said second types is a light emitting diode and the other of said first and second types is a photocell.

12. The apparatus in accordance with claim 11 wherein said first coupler assembly further includes a transparent shield on the face portion thereof for protecting the optical communication means disposed in the aperture of said first coupler assmebly.

13. In a system for electronically communicating information, the combination comprising:

(a) a sealed enclosure;
(b) electronic circuitry disposed inside said sealed enclosure;
(c) a fixed coupler assembly rigidly mounted through a portion of said sealed enclosure including,
 (1) a housing of magnetically conductive material having an aperture therein opening to the outside of said sealed enclosure, and
 (2) a communication device of a first type disposed in the aperture of said housing for communication externally of said sealed enclosure;
(d) means for electrically connecting the communication device of said first type to said electronic circuitry inside said sealed enclosure;
(e) a detachable coupler assembly including,
 (1) a magnet for magnetic attachment to said fixed coupler assembly externally of said sealed enclosure, said magnet having an aperture in one end thereof positioned for alignment with the aperture in the housing of said fixed coupler assembly,
 (2) a communication device of a second type disposed within the aperture of said magnet for communication, out the one end thereof, with the communication device of the first type, when said fixed and detachable coupler assemblies are magnetically attached, and
 (3) means for providing an enable signal for activating said communication means of a second type to permit communication of information upon magnetic attachment of said fixed and detachable coupler assemblies; and
(f) external communication means connected to said communication device of said second type and to the enable signal providing means in said detachable coupler for electroncially communicating information between the electronic circuitry in said sealed enclosure and said external communication means, via the communication devices of the first and second types, when said fixed and detachable coupler assemblies are magnetically attached and said enable signal is provided.

14. The system in accordance with claim 13 wherein said enable signal providing means of said detachable coupler assembly comprises:
(a) a plunger slidably disposed in said magnet, said plunger being movable between at least a first position wherein a first end of said plunger extends beyond the one end of said magnet, and a second position wherein said first end is substantially co-planar with said one end of said magnet; and
(b) switching means, mounted on said detachable coupler assembly in cooperating relationship with said plunger whereby movement of said plunger from said first to said second position causes said switching means to switch from an unactivated to an activated state.

15. The system in accordance with claim 14 wherein said switching means comprises a switch switchable from said unactivated to said activated states by depression of a push-button which is spring loaded in an outward direction, said switch being mounted on said detachable coupler assembly with an outward end of said push-button engaging a second end of said plunger whereby said plunger is biased by said spring loaded push-button in said first position and movement of said plunger from said first to said second position causes the depression of said push-button.

16. The system in accordance with claim 15 wherein the communication means of said first type comprises an optical communication means of a first type and the communication means of said second type comprises an optical communication means of a second type.

17. The system in accordance with claim 16 wherein one of the optical communication means of said first and second types is a light emitting diode and the other of said first and second types is a photocell.

18. The system in accordance with claim 17 wherein said fixed coupler assembly further includes a transparent shield on the face portion thereof for protecting the optical communication means disposed in the aperture of said housing.

19. In a meter of the type including electronic circuitry housed within a meter cover, apparatus for electronically communicating with the electronic circuitry externally of the meter cover comprising:
   (a) a fixed coupler assembly rigidly mounted through a portion of the meter cover, said fixed coupler assembly including,
      (1) a housing of magnetically conductive material, the structure of said housing being characterized by a body having a face portion and being further characterized by first and second apertures extending from the face portion of said body into a cavity formed therein,
      (2) a first optical emitter device,
      (3) a first optical detector device,
      (4) means for mounting said first optical emitter and detector devices in the cavity of said body, whereby said first optical and detector devices may optically communicate through the first and second apertures respectively in the face portion of said body; and
   (b) a second coupler assembly including,
      (1) a magnet for magnetic attachment to said first coupler assembly, the structure of said magnet being characterized by a body having a face portion substantially symmetrical with the face portion of said housing and being further characterized by third and fourth apertures, positioned for symmetrical alignment with said first and second apertures respectively, extending from the face portion of said magnet into a cavity formed therein,
      (2) a second optical emitter device,
      (3) a second optical detector device,
      (4) means for mounting said optical emitter and detector devices in the cavity of said magnet, whereby said second optical emitter and detector devices may optically communicate through the third and fourth apertures respectively in the face portion of said magnet, and
      (5) means for providing an enable signal for activating said second optical emitter and detector devices to permit communication of information upon coupling of said first and second coupler assemblies; and
   (c) means on said first and second coupler assemblies for ensuring alignment of the apertures in the face portions of said housing and said magnet, whereby the first optical emitter device in said housing may communicate with the second optical detector device in said magnet and said first optical detector device in said housing may communicate with said second optical emitter device in said magnet, when said first and second coupler assemblies are magnetically attached to form an optical communication link for the transfer of information and said enable signal is provided by a coupling of said first and second coupler assemblies.

20. The meter in accordance with claim 19 wherein said enable signal providing means of said second coupler assembly comprises:
   (a) a plunger slidably disposed in said magnet, said plunger being movable between at least a first position wherein a first end of said of said plunger extends beyond the face portion of said magnet and a second position wherein said first end is substantially co-planar with the face portion of said magnet; and
   (b) switching means mounted on said second coupler assembly in cooperating relationship with said plunger whereby movement of said plunger from said first to said second positions causes said switching means to switch from an unactivated to an activated state.

21. The meter in accordance with claim 20 wherein said switching means comprises a switch switchable from said unactivated to said activated state by depression of a push-button which is spring loaded in an outward direction, said switch being mounted on said second coupler assembly with an outward end of said push-button engaging a second end of said plunger whereby said plunger is biased by said spring loaded push-button in said first position and movement of said plunger from said first to said second positions causes the depression of said push-button.

* * * * *